United States Patent [19]

House et al.

[11] 4,174,561

[45] Nov. 20, 1979

[54] METHOD OF FABRICATING HIGH INTENSITY SOLAR ENERGY CONVERTER

[75] Inventors: Robert E. House, Reading; Robert A. Irvin; Daniel F. Kane, both of Sudbury, all of Mass.

[73] Assignee: Semicon, Inc., Burlington, Mass.

[21] Appl. No.: 846,173

[22] Filed: Oct. 27, 1977

Related U.S. Application Data

[62] Division of Ser. No. 656,343, Feb. 9, 1976, Pat. No. 4,082,570.

[51] Int. Cl.$^2$ ............................................... B01J 17/00
[52] U.S. Cl. ..................................... 29/572; 29/576 J; 29/583
[58] Field of Search ................... 29/572, 576 B, 576 J, 29/583; 136/89

[56] References Cited

U.S. PATENT DOCUMENTS

| 3,081,370 | 3/1963 | Miller | 136/89 |
|---|---|---|---|
| 3,112,850 | 12/1963 | Garibotti | 29/576 B |
| 3,503,125 | 3/1970 | Haberecht | 29/576 J |
| 3,948,682 | 4/1976 | Bordina | 29/572 |

FOREIGN PATENT DOCUMENTS

751084 1/1967 Canada .................................... 136/89

OTHER PUBLICATIONS

NASA Tech. Memo., "Multiple Junction Edge Illuminated Solar Cell", by Sater, Nov. 13-15, 1973.

*Primary Examiner*—W. Tupman
*Attorney, Agent, or Firm*—Cesari & McKenna

[57] ABSTRACT

A photovoltaic energy converter for converting incident radiant energy, such as solar energy, to electrical energy. The converter comprises a cell formed from a plurality of integrally interconnected p-n junction-containing semiconductor wafers. The wafers are stacked end-to-end in the cell so that the respective junctions in each wafer are parallel to each other. The efficiency and performance of the cell is improved, particularly upon exposure to concentrated sunlight, by imposing various conditions on the cell fabrication and design. Improvements result, for example, by selecting a high resistivity semiconductor as the starting material in the fabrication of the cell, controlling the diffusion process to optimize the junction gradient and minimize the thickness of the base region in each wafer, orienting the wafers in the cell so that they are illuminated at a small angle relative to the plane of the respective junctions therein, and treating the exposed surfaces of the wafer to reduce reflectivity and surface recombination velocities.

20 Claims, 10 Drawing Figures

FIG. 3H

METHOD OF FABRICATING HIGH INTENSITY SOLAR ENERGY CONVERTER

This is a division, of application Ser. No. 656,343 filed Feb. 9, 1976, now U.S. Pat. No. 4,082,570.

BACKGROUND OF THE INVENTION

This invention relates to photovoltaic energy converters and, more particularly, to a multiple-junction photovoltaic cell for converting solar energy to electrical energy and to a method of fabricating the same.

Apparatus for converting solar energy to other forms of useful energy, such as electrical energy, are presently the subject of considerable research. This interest is due largely to the rapidly rising costs of energy derived from conventional resources, such as oil and natural gas, and to a concern for conserving existing supplies of these resources in the wake of rapidly increasing demands for their use.

Photovoltaic devices have been considered as one means of converting solar energy directly to electrical energy. Such devices are typically formed from a semiconductive material, such as silicon or germanium, which is inhomogeneously doped with acceptor and donor impurities to form a p-n junction. Upon exposure to electromagnetic radiation, pairs of mobile charge carriers of opposite polarity, i.e., electrons and holes, are generated. These pairs normally recombine in a relatively short time. The presence of the junction, however, creates a potential gradient which keeps the carrier pairs separated sufficiently long for a net voltage to appear across the junction. This voltage can thus be utilized in an electrical load connected across the junction.

The photovoltaic devices presently known have relatively low energy conversion efficiencies (i.e., typically about 10 percent). When one considers that the intensity of the sun's radiation at the surface of the earth is only of the order of 1,000 watts per square meter, it can be appreciated that terrestrial power generating systems would require relatively large areas of photovoltaic devices to generate even moderate amounts of electrical power. Obviously, such systems would be expensive to fabricate, install and maintain.

It has been proposed to use sunlight concentrators in conjunction with photovoltaic devices to reduce the area of such devices required to generate a given amount of electrical power. Lens systems are available which can be used with the photovoltaic cell to concentrate the intensity of the sun's radiation at the surface of the earth by a factor of 1000 or more. However, it is well known that conventional photovoltaic cells operate even less efficiently under concentrated sunlight. For example, the series resistance of a conventional silicon photovoltaic cell, which is illuminated along a direction perpendicular to the plane of its p-n junction, is typically orders of magnitude too large for the cell to operate efficiently from an electrical standpoint at an illuminated intensity of 100 watts per square centimeter (i.e. terrestrial sunlight concentration by a factor of 1000). Any benefits resulting from increased sunlight concentration have thus been largely offset by low electrical power outputs due to the large series resistance of the cells.

Multiple junction, edge-illuminated photovoltaic cells have been suggested as one possible solution to the high-intensity illumination problem suffered by conventional photovoltaic cells. A semiconductor diode in the multiple-junction, edge-illuminated photovoltaic cell is disposed so that it is illuminated along a direction parallel to the plane of its p-n junction rather than perpendicular to its p-n junction, as in the case of the conventional cell. Several semiconductor diodes can thus be stacked end-to-end in a single cell and electrically connected in series.

Some recent experimental studies have indicated that the series resistance of the multiple-junction cell is significantly lower than that of the comparable conventional cell, and actually decreases with increasing illumination intensities. This has suggested that the multiple-junction cell may be more desirable as a solar energy converter than the conventional cell. Known prior studies of the multiple-junction cells have nevertheless been cursory. If the multiple-junction cell is to be recognized as a viable candidate for use in solar energy conversion systems, detailed, practical information concerning the fabrication and structure of such cells for this purpose is required.

It is, therefore, a general object of this invention to provide an improved photovoltaic energy converter.

Another object of the invention is to provide a multiple junction photovoltaic cell structured and designed for use under high intensity illumination.

Still another object of the invention is to provide a photovoltaic cell of the type described which is structured and designed for efficiently converting concentrated solar energy to electrical energy.

Still another object of the invention is to provide a method of fabricating photovoltaic cells of the type described.

SUMMARY OF THE INVENTION

Briefly, our invention is concerned with the fabrication and design of photovoltaic energy converters. Like the multiple junction, edge illuminated photovoltaic cell discussed above, a photovoltaic energy converter embodied according to our invention comprises one or more cells each of which includes a plurality of semiconductor diodes stacked end-to-end and electrically connected in series. A cell embodied according to our invention, however, incorporates some or all of the below-described characteristics which maximize the conversion efficiency of the cell, particularly under high intensity applications, such as exposure to concentrated sunlight.

According to one aspect of our invention, the conversion efficiency of our photovoltaic cell is increased by maximizing the lifetime of photogenerated carriers in the cell. This is accomplished by choosing a relatively defect-free semiconductor as the starting material in the fabrication of the cell so that the density of possible recombination centers in the cell is minimized. Carrier lifetimes are further increased by choosing the resistivity of the starting semiconductor material to be relatively high. This is possible because the series resistance of each diode in our cell remains low despite the use of the high resistivity starting material as a result of conductivity modulation at high illumination intensities. Float-zone-grown silicon crystals with bulk resistivities in the range of 200 to 400 ohm-centimeters are preferred.

According to another aspect of our invention, the conversion efficiency to our photovoltaic cell is increased by optimizing the junction gradient in each diode. The concentration gradient, a, in the vicinity of the junction in each diode is selected to be relatively low and preferably of the order of $10^4$ impurities per cubic centimeter per micron or less. A junction gradient of this type increases photogenerated carrier lifetimes and improves the long wavelength, i.e. infrared, response of the cell. The junction gradient is controlled by controlling the diode fabrication process. If, for example, a diffusion process is used to form the junction, the temperature and time of diffusion are selected to produce a deep and gradual diffusion profile. For silicon starting materials with thicknesses in the range of about 5–10 mils, diffusion temperatures of about 1200°–1300° Centigrade and diffusion times in the range of about 10 to 50 hours preferred.

According to still another aspect of our invention, the conversion efficiency of our photovoltaic cell is increased by keeping the thickness of the base region in each diode as small as possible, and always less than one diffusion length for a minority charge carrier in that region. Reducing the thickness of the base region in each diode reduces the series resistance of the diode and thus improves the electrical power output from the diode. A base region thickness less than one diffusion length is also important to minimize photogenerated carrier recombination in the base region. With diffused diodes, the thickness of the base region is determined by the overall thickness of the diode and the respective depths of the diffused regions therein.

According to yet another aspect of our invention, the conversion efficiency of our photovoltaic cell is further increased by cutting the individual diodes of the cell so that they are illuminated at a small angle relative to the plane of the p-n junctions therein. This ensures that a maximum junction area is exposed to the incident radiation and at the same time gives rise to a diode geometry which allows increased spreading of the junction depletion layer at and below the exposed surface, thus minimizing the likelihood of voltage saturation at high illumination intensities. This geometry thus allows the use of a thinner base region. The angle is selected so that the lower doped base region in each diode has a larger surface area exposed to the radiation than the more heavily doped region on the opposite side of the junction. Preferably, the inclination is in the range of 5 to 20 degrees relative to the direction of illumination.

According to yet another aspect of our invention, the conversion efficiency of our photovoltaic cell is also increased by treating the exposed surface of the cell to reduce its reflectivity to the incident radiation. This is accomplished by texturizing the exposed surface in a manner which makes it more diffuse but does not increase surface recombination velocities. one such useful technique is to abrade the exposed surface ultrasonically so as to form a matrix of rounded surface pyramids. To further reduce reflectivity, the exposed surface may then be coated with a transparent anti-relection coating of index of refraction intermediate that of the semiconductor and air.

Other conditions may be imposed to further improve the conversion efficiency of a photovoltaic cell embodying our invention. For example, subsequent to the ultrasonic surface etch discussed above, a "slow" etch process may be used on the exposed surface of the cell which renders the surface hydrophobic. This further reduces surface recombination velocities and thus improves collection efficiencies within the cell. Also, the radiant energy that is incident on the cell may be filtered to remove those wavelengths which contribute relatively little to the output of the cell or which cause excessive heating in the cell. Preferably, all wavelengths are filtered out except those in the range of about 5000 to 10,000 Angstroms. The filtering is illustratively accomplished using an appropriately colored or coated plano-convex lens concentrator with the cell.

BRIEF DESCRIPTION OF THE DRAWINGS

The foregoing and other features and advantages of the invention will be better understood from the following detailed description taken in conjunction with the accompanying drawings in which:

FIG. 3, comprising

DETAILED DESCRIPTION OF ILLUSTRATIVE EMBODIMENTS

1. Photovoltaic Cell Structure

Figure 1:
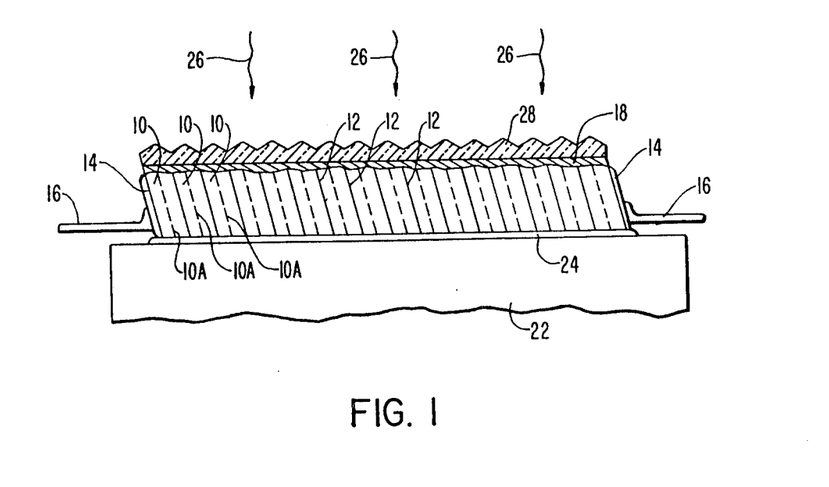
FIG. 1 is an end view of a photovoltaic cell embodied in accordance with the invention.

FIG. 1 illustrates a photovoltaic cell embodied according to our invention. The cell comprises a plurality of semiconductor diodes 10 which may be of silicon into which impurities are diffused to form a p-n junction 10A. The plane of the junction 10A in each diode 10 is parallel to the end faces of the diode. The diodes 10 are stacked end-to-end and fused together with a plurality of electrically conductive interface layers 12 interposed between successive diodes 10. Electrically conductive contact layers 14 are formed on the end surfaces of each of the two end diodes 10 in the cell. Electrical leads 16 attach to each of the contact layers 14.

The cell is coated with a protective outer coating 18 which is also transparent to radiant energy. The cell is fixed to a substrate 22 by a layer of adhesive 24. The substrate 22 may in turn be mounted on a suitable heat sink (not shown).

The arrows 26 in FIG. 1 indicate the direction of incidence of the radiant energy to be converted by the cell, which is illustratively solar energy. A multiple plano-convex lens 28 (i.e., essentially flat on the cell side and convex on the opposite side over each junction) is placed on the top surface of the cell to concentrate and direct the radiant energy to the regions of the junction 10A in each diode 10.

In operation, the radiant energy absorbed within each diode 10 generates electron and hole pairs therein. The junction 10A establishes a potential gradient within the diode 10 which urges the electrons to collect on one side of the junction 10A and the holes to collect on the opposite side of the junction. Provided the lifetimes of the photogenerated carriers are sufficiently long, a net voltage will appear across the junction 10A in each diode 10. As the individual diodes in the cell are electrically connected in series, the cell voltage across the leads 16 is the sum of the individual voltages generated by the diodes 10. The cell voltage is thus available for electrical utilization in a load. Typically, a plurality of cells like the cell shown in FIG. 1 are interconnected in series and/or parallel to provide an electrical output of the desired characteristics.

Figure 2:
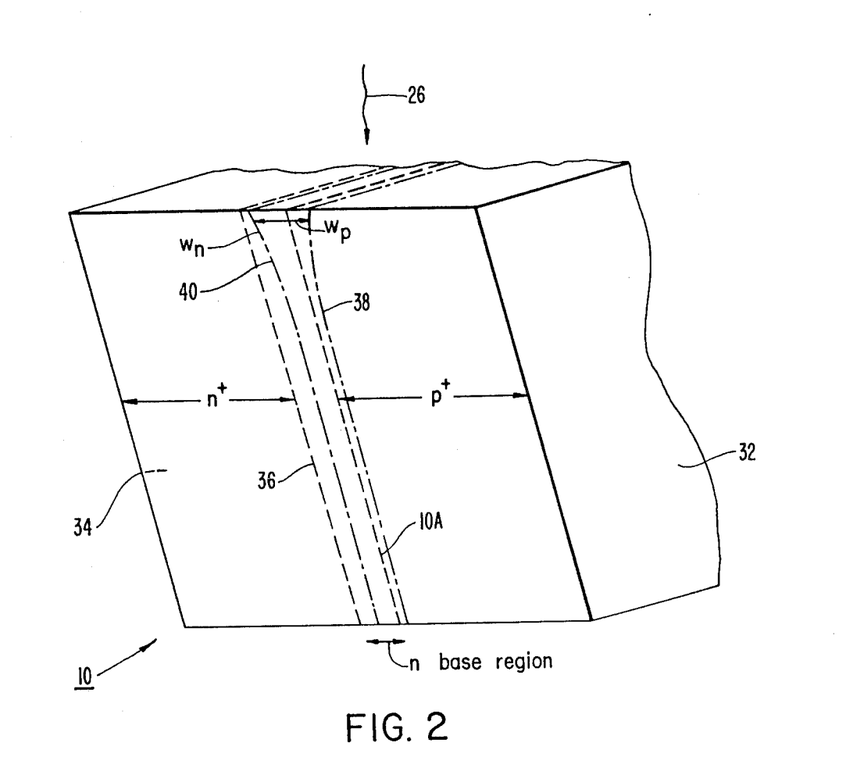
FIG. 2 is an enlarged view showing further details of one of the semiconductor diodes in the photovoltaic cell of FIG. 1.

FIG. 2 is an enlarged illustration of one of the diodes 10 shown in the cell of FIG. 1. Each diode 10 is illustratively fabricated from a wafer of n-type silicon. Acceptor impurities are diffused into one end face 32 of the wafer to create a p-type conductivity region. As is known, the junction 10A is defined as the plane in which the concentration of p-type impurities is equal to the concentration of n-type impurities. Donor impurities are illustratively diffused into the opposite end face 34 of the wafer to create an n+ region. The n+ region provides a low resistivity interface to adjacent diodes 10 and is defined as the region of the diode 10 to the left of the plane represented by the dashed line 36. The region between the junction 10A and the lines 36 is the bate region of the diode 10. The dashed-dotted lines 38 and 40 represent the boundaries of the junction depletion spread $^w p$ and $^w n$, respectively, under maximum open circuit voltage, and will be discussed in more detail below.

2. Fabrication and Design Conditions

As noted, we have found that the efficiency of a photovoltaic cell of the type illustrated in FIG. 1 can be increased by imposing certain conditions on the fabrication and design of the cell. These conditions, and a brief explanation of the reasons therefor, are presented below.

A. Semiconductor Quality

The starting material in the fabrication of the cell is selected to be a semiconductor crystal which is essentially free of defects, such as dislocations, stacking faults and metal impurities. This has the effect of minimizing the density of recombination centers in the cell and thus maximizing the lifetime of photogenerated carriers therein. For this purpose, float-zone crystal growth techniques of the type described by Keck, Green and Polk in Volume 24 of the *Journal of Applied Physics*, page 1479 (December 1953) are preferred over other known growth techniques for fabrication of the starting semiconductor. Preferably, the defect density of the starting semiconductor is less than about 1000 E.P. (etch pits) per square centimeter.

B. Semiconductor Resistivity

The starting semiconductor material is also selected to have a relatively high resistivity, preferably in the range of about 200 to 400 ohm-centimeters. This also increases the lifetime of photogenerated carriers in the cell. In conventional photovoltaic cells, the resistivity of the starting material is usually selected to be relatively low, e.g. about 20 ohm-centimeters or less, since, in those cells, it is the major contributing factor to the series resistance of the cell. In photovoltaic cells embodied according to our invention, however, the resistivity of the starting material does not contribute significantly to the series resistance of the cell, particularly at high illumination intensities. This is believed to result from a conductivity modulation in the diodes of the cell due to the presence of large excess photogenerated carrier concentrations at high illumination intensities.

C. Junction Gradient

The concentration gradient, a, in the vicinity of the junction in each diode of the cell is selected to be relatively low and preferably of the order of $10^4$ impurities per cubic centimeter per micron or less. In prior photovoltaic cells, the junction concentration gradients, a, are typically orders of magnitude larger than this value. A properly graded junction of this type increases photogenerated carrier lifetimes and thus increases the number of carrier pairs which diffuse to and are separated by the junction field prior to recombining.

With junction concentration gradients, a, of the order of $10^4$ impurities per cubic centimeter per micron or less, carrier lifetimes greater than about 10 microseconds are possible. Such enhanced carrier lifetimes provide significant improvements in the long wavelength, i.e. infrared, response of the cell. This is particularly important in solar applications, as a significant fraction of solar radiation is concentrated in the infrared and near infrared portions of the electromagnetic spectrum. The enhanced carrier lifetimes also minimize the likelihood of voltage saturation of each diode at high illumination intensities.

Diffusion has been found to be the preferred technique for forming junctions with the desired concentration gradient characteristics. If, in diffusion, the surface concentration of a diffusant is $N_o$ impurities per cubic centimeter, then the concentration $N$ at a depth $X$ below the diffused surface is given by $$N = N_o \, erfc \, \frac{X}{\sqrt{Dt}} \quad (1)$$

where D is the diffusion constant of the impurity at the diffusion temperature, and t is the diffusion time. The concentration gradient, a, at the junction where N approaches the impurity level of the base region of the diode is then given by $$a = \frac{dN}{dX}\bigg|_{X \longrightarrow X_j} = \frac{-N_o}{\sqrt{\pi Dt}} \exp \frac{-X_j^2}{4 Dt} \quad (2)$$

where $X_j$ is the junction depth below the diffused surface. As noted, the optimum concentration gradient, a, in the vicinity of the junction is $10^4$ impurities per cubic centimeter per micron or less.

The desired junction concentration gradient, a, for each diode can be achieved by controlling the diffusion parameters of time t and temperature T to produce a deep and gradual diffusion profile. With silicon starting materials of thicknesses in the range of about 5–10 mils, preferable results are obtained with diffusion times in the range of about 10 to 50 hours and diffusion temperatures in the range of about 1200° to 1300° Centigrade.

D. Base Region Thickness

The thickness of the base region in each diode of our cell is selected to be as small as possible and always less than one diffusion length for a minority carrier in that region. A thin base region ensures a low series resistance, reduces internal heating, and thus improves the electrical power output from the cell. A base region thickness less than one diffusion length is important to minimize the likelihood of photogenerated carrier recombination in the base region. Carriers which recombine in the base region of the diode contribute nothing to the output of the cell.

A typical value for the minority carrier diffusion length in the base region is about 100 microns. Thus, base region thicknesses less than 100 microns, and preferably as small as 25 to 50 microns are employed.

E. Junction Orientation

The diodes in our cell are sliced and stacked so that the junctions therein are inclined at a small angle relative to the direction of illumination, as indicated in FIGS. 1 and 2. In a conventional photovoltaic cell, the diode is illuminated along a direction normal to the plane of its junction, while in the edge-illuminated, multiple-junction photovoltaic cell discussed above, the diodes were illuminated along a direction parallel to the junctions therein. We have found that improved results are obtained by orienting the junctions in our cell so that the incident radiation deviates from parallel to the junctions by a small angle. The direction of the deviation is selected so that the lower doped base region in each diode has a larger surface area exposed to the radiation than the more heavily doped p region on the opposite side of the junction. Preferably, the deviation angle is in the range of about 5 to 20 degrees.

Inclining the junctions in our cell in this manner ensures that a significant junction area is exposed to the incident radiation and at the same time gives rise to a diode geometry which allows increased spreading of the junction depletion layer at high illumination intensities without suffering voltage saturation.

The depletion layer boundaries at maximum open circuit voltage $V_{oc}$ for the p and n regions of the diode 10 are indicated by the dashed-dotted lines 38 and 40, respectively, in FIG. 2. As indicated in FIG. 2, depletion spread in the lower doped base region is greater than the depletion spread in the more heavily doped p region. Also, the depletion spread in both regions increases as the exposed surface of the diode is approached due to the larger photogenerated carrier concentrations near the surface. Voltage saturation occurs when the depletion spread $w_n$ becomes large enough to extend across the base region and to approach the boundary 36 of the n+ region in the diode. By inclining the junction 10A as indicated in FIG. 2, more space is provided for depletion layer spreading near the exposed surface. This allows our cell to operate at higher illumination intensities without experiencing voltage saturation. It also allows the use of a thinner base region.

F. Surface Reflectivity

The exposed surface of the cell is treated to minimize reflectivity at the surface. The photogenerated voltage in each diode of the cell is a function of the number of photons of the proper wavelength captured therein. Thus, texturizing the surface so as to make it more diffuse increases the probability of photon capture within each diode. The technique for texturizing the surface, however, should be such that it does not increase the surface recombination velocities. One such technique is to abrade the surface ultrasonically using an ultrasonic cutting tool which provides a matrix of rounded surface pyramids, the base edges of which are approximately equal to the overall diode thickness. With such a surface configuration, some of the incident radiation that is normally lost due to reflection strikes an adjacent pyramid where it is refracted and absorbed within the cell. A surface configuration of the type described is capable of reducing the surface reflectivity of the cell by at least 50 percent. Further reductions in the reflectivity may be achieved by sputtering onto the texturized surface of the cell a transparent anti-reflection coating having an index of refraction between that of the semiconductor material and air. An anti-reflection coating of this type also serves to passivate the surface.

G. Surface Recombination Velocities

The exposed surfaces of the cell are also treated to reduce surface recombination velocities. This is achieved by subjecting the surfaces to a "slow" etch which renders the surface hydrophobic.

The open circuit voltage $V_{oc}$ relates to the photogenerated current and saturation current of each diode as follows:

$$V_{oc} \sim \log (I_p/I_o) \qquad (3)$$

where $I_p$ represents the photogenerated current in the diode and $I_o$ represents the saturation current. The saturation current $I_o$ is in turn a strong function of the recombination velocities in the base region and at the exposed surface. Untreated surfaces typically have surface recombination velocities of the order of $10^3$ centimeters per second. At that level, the saturation current $I_o$ is sufficiently large to reduce the open circuit voltage and the conversion efficiency of the diode considerably.

By rendering the exposed surface hydrophobic, however, recombination velocities can be reduced by at least an order of magnitude to $10^2$ centimeters per second. This results in material improvements in the open circuit voltage and conversion efficiency of each diode.

H. Wavelength Band of Incident Radiation

The radiant energy to which the cell is exposed is filtered to pass the wavelength range of about 5000 to 10,000 Angstroms. Wavelengths shorter than 5000 Angstroms cause excessive heating of the cell. In general, as is known, a hotter cell operates less efficiently than a cooler cell. Also, silicon, the most likely semiconductor material for the cell, does not respond to wavelengths greater than about 10,000 Angstroms. A convenient way to provide the desired filtering of incident radiation is to color the plano-convex lens 28 (FIG. 1) by coating or doping it with an appropriate material or materials which reflect wavelengths outside the desired range.

3. Illustrative Fabrication Method

An illustrative method for fabricating the photovoltaic cell shown in FIG. 1 is described below, with reference being made to FIG. 3 of the drawings. The various illustrations in FIG. 3 are not necessarily drawn to proportion or relative dimensions.

Figure 3A:
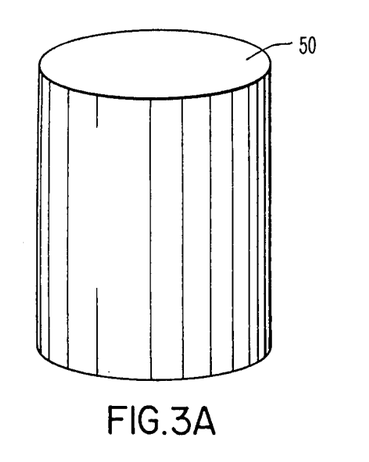
FIGS. 3A through 3H, illustrate various stages in the fabrication of the photovoltaic cell shown in FIG. 1.

As indicated in FIG. 3A, we start with a single crystal 50 of n-type silicon. The crystal is grown using the float-zone growth technique described in the above-cited *Journal of Applied Physics* article. Preferably, the defect density of the starting crystal is less than about 1000 E.P. per square centimeter. As grown, the crystal is selected to have an n-type carrier concentration of the order of $10^{13}$ atoms per cubic centimeter (cm$^3$) and a resistivity of 250 ohm-cm.

Figure 3B:
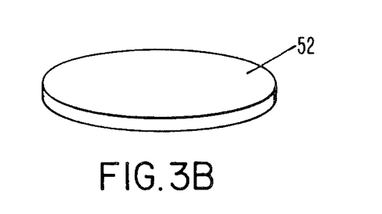

The crystal is next sawed into thin wafers using a conventional diamond saw. One such wafer 52 is shown in FIG. 3B. Each wafer 52 is lapped using an abrasive lapping compound to a thickness of about 5 mils and is then cleaned in a solution consisting of 50% hydrogen peroxide and 50% ammonium hydroxide. Alternatively, the wafers 52 are etched to the 5 mil thickness in a solution consisting of 84% nitric acid and 16% hydrofluoric acid.

A layer 54 of a donor-containing compound, such as ammonium phosphate, is deposited on one end face of the wafer and allowed to dry. A layer 56 of an acceptor-containing compound such as boron oxide, is deposited on the opposite end face of the wafer and also allowed to dry. These layers may be sprayed or spun onto the wafer 52 using conventional techniques. An alternative approach is to deposit the donor and acceptor layers 54 and 56 on the wafer by exposing the respective end faces of the wafer to gaseous atmospheres containing the appropriate impurities.

Figure 3C:
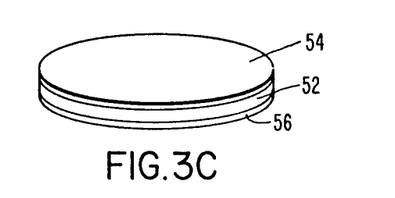

A coated wafer is shown in FIG. 3C. The donor and acceptor concentrations in the donor and acceptor layers 54 and 56, respectively, are each of the order of $10^{21}$ atoms per $cm^3$. The thicknesses of the two layers are sufficiently large for both layers to be considered an infinite source of the impurities.

The coated wafers are then placed on edge in a quartz carrier, or boat, and heated for 25 hours at 1200° Centigrade. The wafers are then "slow" cooled at a rate of about 200° Centigrade per hour. After this process, the wafers have their opposite end faces converted to low resistivity n-and p-type conductivity silicon. With the above-noted diffusion parameters and wafer thickness (5 mils), the p-n junction in each wafer is about 50 microns below the p-diffused end face. The base region of the wafer has a thickness of about 25 microns. The concentration gradient, a, in the vicinity of the junction is about $10^4$ impurities per $cm^3$ per micron.

The next step in the process is to remove the excess boron and phosporous glass which has formed on the end faces of the wafers during diffusion. This is accomplished by bombarding the wafers with a steady stream of 27.5 micron aluminum oxide particles or by etching the wafers for a period of 10 minutes in a 10% KOH solution at about 90° C.

Discs 58 of the same diameter as the silicon wafers are then cut from a 1 mil thick sheet of a 99% silver and 1% aluminum alloy. The small percentage of aluminum in the alloy improves the ohmic contact of these discs to the semiconductor of the wafers. To insure cleanliness, the metal discs are dipped for 30 seconds in 20% nitric acid solution, rinsed and dried.

Figure 3D:
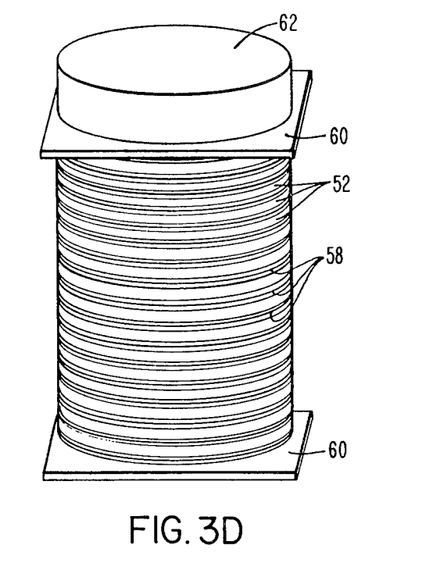

Alternative layers of silicon wafers 52 and metal discs 58 are then stacked as indicated in FIG. 3D. The silicon wafers 52 are dipped in isopropyl alcohol prior to stacking to insure cleanliness. The wafers 52 are oriented in the stack so that the p and n+ conductivity regions therein all face in the same direction. A flat carbon plate 60 is then placed on the top and bottom of the stack. The stack is pressed together by a stainless steel weight 62. The carbon plates 60 shield the stack from the weight 62 and the surface upon which the stack rests during fusion.

The stack is next placed in forming gas atmosphere and heated to a temperature of 900° C. for a period of 10 minutes. The various components of the stack are thus fused together. The number of silicon wafers 52 in the stack is limited only by the technique used below for slicing thin slabs from the stack. Good results are obtained using 16 silicon wafers in each stack.

Figure 3E:
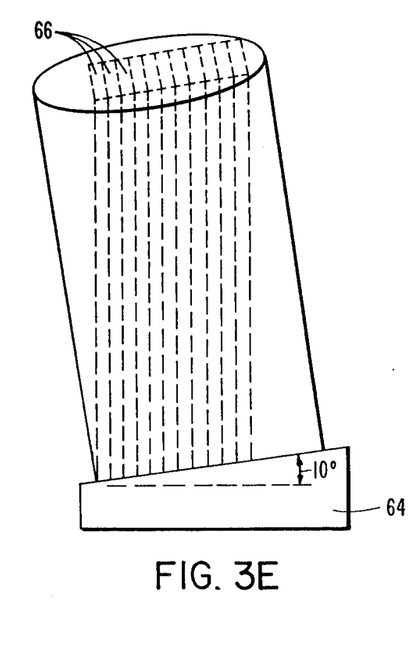
Figure 3F:
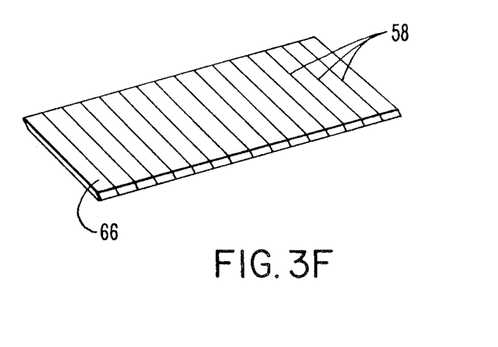

As shown in FIG. 3E, the carbonplates 60 and weight 62 are removed and the fused stack is waxed to a glass plate 64, the upper surface of which is inclined at an angle of about 10 degrees from horizontal. As a result, the junctions in each wafer are also inclined at 10 degrees from horizontal. The stack is then cut through along vertical planes to produce a plurality of slabs 66, each of which is about 40 mils in thickness. A diamond saw or a slurry saw may be used for this purpose. The edges of the stack are also cut through so that the slabs 66 are rectangles. The slabs 66 are removed from the glass plate by dissolving the wax layer in an alcohol bath. One slab 66 is shown in FIG. 3F. Each one of the slabs 66 can now be fabricated into an individual cell.

The next step in the method is to identify which one of the two opposed major transverse surfaces of each slab 66 is to be exposed to the incident radiation. The exposed surface selection is important because of the inclined cutting of the junctions in the diodes of each slab. If a slab 66 is viewed along a normal to one of its two major transverse surfaces, the junctions in the diodes therein are inclined such that more surface area of the n-type base region is exposed than of the p-type region. If, on the other hand, the slab 66 is viewed along a normal to the other of the two major transverse surfaces, more surface area of the p-type region is exposed than of the n-type region. The surface to be exposed to incident radiation is the former one, that is, the one which maximizes the exposed n-type base region surface area rather than the p-type region. That surface is thus labeled or otherwise identified as the "top" surface of the slab 66.

Figure 3G:
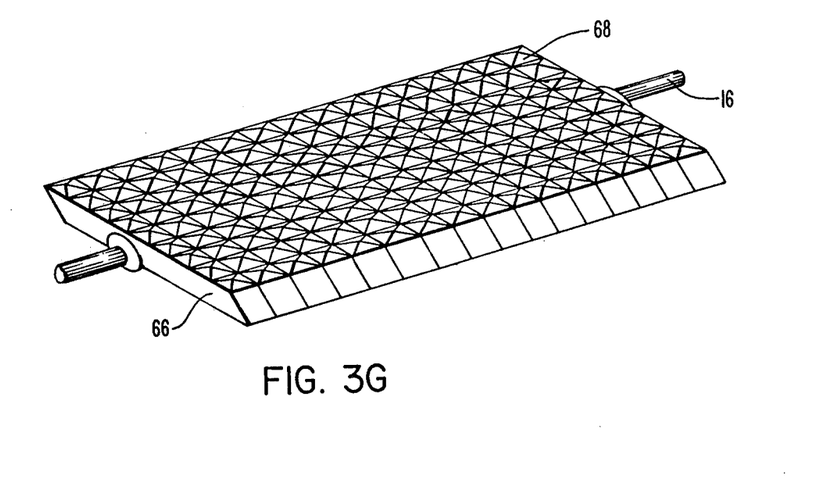

The "top" surface 68 of a slab 66 is next treated to reduce its reflectivity. This is accomplished by ultrasonically cutting that surface to form thereon a matrix of rounded surface pyramids. One such treated slab 66 is illustrated in FIG. 3G. After this treatment, the "top" surface of the slab 66 has a texture similar to that of a worn file. The base edges of each surface pyramid is selected to be approximately equal to the initial wafer thickness (e.g. 5 mils). Ultrasonic cutting techniques and tools useful for this purpose are well known in the semiconductor fabrication art.

An alternative is to roughen all surfaces of the slab 66 to reduce reflectivity by soaking the slab for a period of 15 minutes in an "OH" etch solution such as an Oakite 190 solution at a temperature of 90° C. Oakite 190 is available from Oakite Products, Inc. of Berkeley Heights, New Jersey.

The surfaces of the slab 66 are next treated to reduce surface recombination velocities. This is accomplished by subjecting the slab to a "slow" etch solution, such as a solution consisting of 75% nitric acid 12.5% hydroflouric acid and 12.5% sulphuric acid, for a period of 5 minutes. The slab is then rinsed, dipped for a period of two minutes in nitric acid and then quenched in an alcohol bath. The surfaces of the slab 66 are thereby made hydrophobic. A treatment of this type reduces surface recombination velocities by about an order of magnitude.

Electrical leads 16 (also shown in FIG. 1) may now be soldered to the ends of the slab 66. The leads 16 may be of silver or annealed copper. The slab 66 next is protected with a thin (e.g. several thousand Angstroms thick) coating 18 (also shown in FIG. 1) of silicone varnish. As an alternative, the coating 18 may consist of an oxide of tantalum, titanium or silicon which is deposited on the slab 66 by means of a sputter technique. A third approach is to deposit the thin coating 18 from glass. By choosing the index of refraction of the coating 18 to be approximately 2.0 to 3.0, an effective anti-reflection coating is provided. This coating 18 also serves to passivate the surfaces of the slab 66.

Figure 3H:
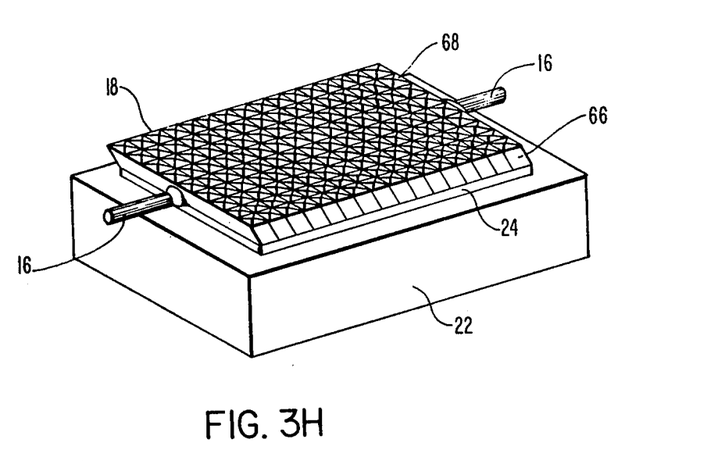

As indicated in FIG. 3H, the transverse surface of the slab 66 opposite to the "top" surface 68 can now be mounted to a substrate 12 (also shown in FIG. 2). A layer 24 (also shown in FIG. 2) of a thermally conductive, electrically insulative adhesive, such as an epoxy, is used for this purpose.

The protective coating 18 over the "top" surface of the slab 66 may now be covered with a plastic plano-convex lens layer 28 (FIG. 1). The focal length of each convex portion of the lens 28 is selected so that it concentrates incident radiation at the regions of the junctions in the wafers. The transmission characteristics of the plastic lens are controlled so that it acts as a band-pass filter for wavelengths in the range of about 5000 to 10,000 Angstroms. This is accomplished by coating or doping the plastic material of the lens 28 with materials reflective to wavelengths outside that range. For example, the lens 28 may be made of a plastic such as polymethylmethacrylate which is treated with an analine dye such as cyanine which increases its transmission coefficient for red wavelengths and decreases its transmission coefficient for blue wavelengths.

We fabricated a number of photovoltaic cells using the above-described illustrative method. The cells did not include the plano-convex lens layer 28 shown in FIG. 1, nor was the radiation made incident on the cells filtered to the preferred wavelength range. These cells were tested under exposure to various solar intensities and the power outputs therefrom compared to similar results from a conventional, normally illuminated photovoltaic cell. The results are summarized below.

| Solar Intensity (AMO's) | Output Power (milliwatts/cm$^2$) | |
|---|---|---|
| | Our cell | Conventional cell |
| 0.5 | 5 | 10 |
| 1.0 | 10 | 15 |
| 5.0 | 80 | 50 |
| 10.0 | 100 | 60 |
| 20.0 | 120 | 80 |
| 50.0 | 160 | |
| 100.0 | 1000 | |
| 150.0 | 1200 | — |

The results demonstrated the superior performance of our cell under high intensity applications.

4. Conclusion

In summary, therefore, we have described a photovoltaic cell which possesses significant performance advantages over conventional photovoltaic cells, particularly in high illumination intensity applications. The conversion efficiency of a cell embodied according to our invention is optimized by imposing various conditions on the fabrication and design of the cell. These conditions can be incorporated into our cells without unduly complicating or adding to the cost of cell fabrication. Our cells are expecially attractive for use with solar radiation, and, unlike conventional cells, permit the use of large solar radiation concentration factors. With all of these advantages, our cells are useful in various energy conversion systems, and particularly in terrestrial solar-power-generating systems.

It should be understood that the above description is intended to illustrate, but not limit, our invention. Numerous variations and modifications of the above-described embodiments will be recognized as possible by those skilled in the art without departing from the scope of our invention. The specific materials, dimensions and other parameters mentioned above are illustrative only, and may be varied in any particular embodiment. For example, p-type silicon or any other suitable semiconductor may be used as the starting material for the cell. Dopants other than boron and phosphorous may be used. Although diffusion has been discussed exclusively above, other techniques may be found useful in the fabrication of the cells, such as epitaxial growth techniques or ion bombardment. In electrically conductive interface layers 12 and contact layers 14 need not be metallic conductors, but can be monocrystalline or polycrysalline semiconductors of low resistivity. Also, in place of, or in addition to, the plano-convex lens concentrator mentioned above, a mirror arrangement may be used to provide or improve the desired radiation concentration factors at the cell.

Furthermore, it should be noted that a power generating system typically combines a large number of the cells described above. These cells can be mounted on a common substrate and heat sink and interconnected in series and/or parallel, using conventional electrical interconnection techniques, to provide a useful output of the desired form.

Hence, we believe that these and other modifications are clearly within the time spirit and scope of the invention, and it is the object of the appended claims to cover all such modifications.

What we claim as new and desire to secure by Letters Patent of the United States is:

1. A method of fabricating a photovoltaic energy converter for converting incident radiant energy to electrical energy, said method comprising the steps of:
   A. preparing a plurality of wafers of semiconductive material of a first conductivity type, each said wafer having
      i. first and second opposed end faces,
      ii. a first region below the first end face having a net impurity concentration of a second conductivity type,
      iii. a second region below the second end face having a net impurity concentration of the first conductivity type greater than the concentration in
      iv. a base region located between said first and second regions, and
      v. a photovoltaic junction separating said first and base regions;
   B. preparing a plurality of layers of an electrically conductive material;
   C. stacking said wafers and conductive layers in a stack with said wafers and conductive layers in alternate layers, said wafers being oriented in the stack so that the first region in each said wafer is directed toward the same end of the stack;
   D. fusing the stack to form an integrally bonded unit;
   E. cutting from the fused stack a slab defining first and second opposed major surfaces transverse to the junctions of said wafers, the cut forming the second transverse surface of the slab being made along a plane that deviates from a normal to the junction in each said wafer by a predetermined small angle in a direction such that when said slab is viewed through the second transverse surface more of the base region and less of the first region in each said wafer is exposed thereby to provide increased space for junction depletion layer spreading at and below the second transverse surface; and
   F. mounting the first transverse surface of said slab on a substrate, said slab being positioned on said substrate for exposure to the radiant energy along a direction essentially normal to the second transverse surface of said slab.

2. A method as recited in claim 1 in which the semiconductive material in said wafer preparing step is selected to have a resistivity in the range of about 200 to 400 ohm-centimeters.

3. A method as recited in claim 1 in which said wafer preparing step comprises the steps of:
   i. growing a single crystal of the semiconductive material using a float-zone-growth technique, and
   ii. cutting said plurality of wafers from said single crystal.

4. A method as recited in claim 3 in which said wafer preparing step includes the additional step of diffusing into the first end face of each said wafer a diffusant of the second conductivity type to form the junction therein.

5. A method as recited in claim 4 in which the diffusant of the second conductivity type is diffused into said wafer so as to have a concentration gradient, a, in the vicinity of the junction of the order of $10^4$ impurities per cubic centimeter per micron or less.

6. A method as recited in claim 3 in which said wafer preparing step includes the additional steps of:
   i. depositing a layer on the first end face of each said wafer containing an effectively infinite source of the diffusant of the second conductivity type,
   ii. heating said wafer to a temperature of about 1200°–1300° Centigrade, and
   iii. maintaining said wafer at the elevated temperature for a time period in the range of 10 to 50 hours.

7. A method as recited in claim 3 in which the semiconductive material in said wafer preparing step is n-type silicon having an n-type carrier concentration of the order of $10^{13}$ per cubic centimeter, and in which said wafer preparing step includes the additional steps of:
   i. depositing a first layer on the first end face of said each wafer containing an effectively infinite source of a p-type diffusant, said first layer having a p-type carrier density of the order of $10^{21}$ per cubic centimeter,
   ii. depositing a second layer on the second end face of each said wafer containing an effectively infinite source of a n-type diffusant, said second layer having an n-type carrier density of the order of $10^{21}$ per cubic centimeter,
   iii. heating said wafer to a temperature of about 1200° Centigrade, and
   iv. maintaining said wafer at the elevated temperature for a time period of about 25 hours.

8. A method as recited in claim 1 in which said conductive layer preparing step comprises the step of cutting a plurality of discs corresponding in dimensions other than thickness to said wafers from a sheet of metal alloy consisting essentially of 99% silver and 1% aluminum.

9. A method as recited in claim 1 in which the number of said wafers stacked in said stacking step is sixteen.

10. A method as recited in claim 1 in which said fusing step comprises heating the stack in a forming gas atmosphere to a temperature of about 900° Centigrade for a time period of about 10 minutes.

11. A method as recited in claim 1 in which the predetermined angle in said cutting step is in the range of about 5 to 20 degrees.

12. A method as recited in claim 11 in which the predetermined angle in said cutting step is about 10 degrees.

13. A method as recited in claim 1 further including the step of:
   H. treating the second transverse surface of said slab to reduce reflectivity of the radiant energy.

14. A method as recited in claim 13 in which said treating step comprises ultrasonically cutting the second transverse surface of said slab to form thereon a surface matrix of rounded pyramids, the base edges of the surface pyramids being comparable to the width of said wafers.

15. A method as recited in claim 1 further including the step of:
   I. rendering the surfaces of said slab hydrophobic to reduce surface recombination velocities.

16. A method as recited in claim 15 in which said rendering step comprises the steps of:
   i. subjecting said slab to a slow etch solution consisting essentially of 75% nitric acid, 12.5% hydrofluoric acid and 12.5% sulphuric acid for a time period of about 5 minutes,
   ii. rinsing said slab,
   iii. subjecting said slab to an etching liquid consisting essentially of nitric acid for a period of about two minutes, and
   iv. quenching said slab in an alcohol bath.

17. A method as recited in claim 1 further including the step of:
   J. depositing a coating of transparent material on said slab having an index of refraction intermediate to that of the semiconductive material of said wafer and air.

18. A method as recited in claim 1 further including the step of:
   K. covering the second transverse surface of said slab with plano-convex lens radiation concentrator having a focal length such that it concentrates the incident radiant energy at the region of the junction in each said wafer.

19. A method as recited in claim 18 in which said covering step further includes the step of controlling the radiation transmission characteristics of said plano-convex lens concentrator so that it preferentially passes to said slab a portion of the radiant energy having wavelengths in the range of about 5000 to 10,000 Angstroms.

20. A method as defined in claim 1 in which said cutting step comprises the steps of:
   i. mounting the fused stack to a support disposed at the predetermined angle to a reference plane,
   ii. cutting the slab from the mounted stack by a pair of spaced parallel cuts normal to the reference plane, the slab thereby defining a pair of opposed major surfaces transverse to the junctions in each said wafer, and
   iii. selecting as the second transverse surface of the slab the one of the pair of the major surfaces that exposes more of the base region and less of the first region in each said wafer.

* * * * *